(12) United States Patent
Ishikura et al.

(10) Patent No.: US 7,611,827 B2
(45) Date of Patent: Nov. 3, 2009

(54) PHOTOSENSITIVE RESIN COMPOSITION, INK JET HEAD USING PHOTOSENSITIVE RESIN COMPOSITION, AND PROCESS FOR MANUFACTURING INK JET HEAD

(75) Inventors: Hiroe Ishikura, Kawasaki (JP); Shoji Shiba, Kawasaki (JP); Akihiko Okano, Atsugi (JP)

(73) Assignee: Canon Kabushiki Kaisha, Toyko (JP)

( * ) Notice: Subject to any disclaimer, the term of this patent is extended or adjusted under 35 U.S.C. 154(b) by 304 days.

(21) Appl. No.: 10/577,255

(22) PCT Filed: Jun. 24, 2005

(86) PCT No.: PCT/JP2005/012160

§ 371 (c)(1),
(2), (4) Date: Apr. 26, 2006

(87) PCT Pub. No.: WO2006/001515

PCT Pub. Date: Jan. 5, 2006

(65) Prior Publication Data

US 2007/0081048 A1  Apr. 12, 2007

(30) Foreign Application Priority Data

Jun. 28, 2004 (JP) .............................. 2004-190484

(51) Int. Cl.
*G03F 7/26* (2006.01)
(52) U.S. Cl. ..................... 430/312; 430/270.1; 430/320
(58) Field of Classification Search ............. 430/270.1, 430/326, 311, 319, 320, 312
See application file for complete search history.

(56) References Cited

U.S. PATENT DOCUMENTS 5,314,945 A * 5/1994 Nickle et al. ................ 524/507

(Continued)

FOREIGN PATENT DOCUMENTS

EP  1117004  7/2001

(Continued)

*Primary Examiner*—Cynthia H Kelly
*Assistant Examiner*—Anca Eoff
(74) *Attorney, Agent, or Firm*—Fitzpatrick, Cella, Harper & Scinto

(57) ABSTRACT

A positive type photosensitive resin composition comprises a polyacrylate resin having, in the structure, at least a structural unit represented by the following general formula (1):

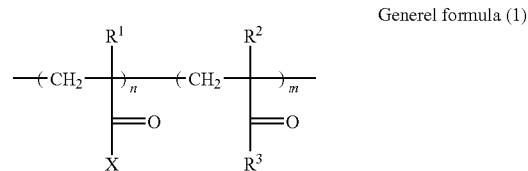

Generel formula (1)

wherein X represents a hydroxyl group, an alkylol group having 2 to 4 carbon atoms, or a methylolamino group; $R^1$ and $R^2$ independently represents a hydrogen atom, or an alkyl group having 1 to 3 carbon atoms; $R^3$ represents an alkyl group having 1 to 3 carbon atoms, an alkoxyl group having 1 to 3 carbon atoms, or an aralkyl group having an aryl group or alkyl group with 1 to 2 carbon atoms; n represents a positive integer; and m represents 0 or a positive integer, and a condensable crosslinker.

10 Claims, 4 Drawing Sheets

U.S. PATENT DOCUMENTS

| | | | |
|---|---|---|---|
| 5,716,740 A * | 2/1998 | Shiba et al. | 430/7 |
| 5,919,601 A | 7/1999 | Nguyen et al. | 430/278.1 |
| 6,074,802 A * | 6/2000 | Murata et al. | 430/270.1 |
| 6,180,294 B1 | 1/2001 | Shiba et al. | 430/7 |
| 6,461,798 B1 | 10/2002 | Ohkuma et al. | 430/320 |
| 6,824,948 B1 | 11/2004 | Aoai et al. | 430/170 |
| 2003/0011655 A1* | 1/2003 | Miyagawa et al. | 347/20 |
| 2003/0134222 A1 | 7/2003 | Lee et al. | 430/191 |
| 2004/0072107 A1 | 4/2004 | Kubota et al. | 430/320 |
| 2004/0081914 A1 | 4/2004 | Imai et al. | 430/281.1 |

FOREIGN PATENT DOCUMENTS

| | | |
|---|---|---|
| EP | 1380423 | 1/2004 |
| JP | 10-153854 | 6/1998 |
| JP | 2000-147783 | 5/2000 |
| KR | 2000-0029115 | 5/2000 |
| KR | 2001-0088315 | 9/2001 |
| KR | 2004-0005699 | 1/2004 |

* cited by examiner

PHOTOSENSITIVE RESIN COMPOSITION, INK JET HEAD USING PHOTOSENSITIVE RESIN COMPOSITION, AND PROCESS FOR MANUFACTURING INK JET HEAD

TECHNICAL FIELD

The present invention relates to a novel photosensitive resin composition. The present invention also relates to an ink jet head for ejecting a liquid used in an ink jet recording system and the like, and a process for manufacturing the same. More specifically, the present invention relates to a process for manufacturing an ink jet head, wherein an ink flow path is formed by providing a photosensitive resin that contributes to the formation of the ink flow path on a substrate for the ink jet head, and after further providing a coating resin layer that forms an ink flow path wall on the photosensitive resin, the photosensitive resin in the ink flow path is dissolved and removed; and to an ink jet head manufactured by such a process.

BACKGROUND ART

As an ink jet head that performs recording using an ink jet recording system (liquid ejecting recording system), the head having a following structure is typical. Specifically, it is an ink jet head having a discharge port for discharging the ink, an ink flow path communicated with the discharge port and including a pressure generating element for discharging the ink, a substrate on which the pressure generating element is formed, and an ink flow path wall for forming the ink flow path by joining with the substrate.

As a process for manufacturing such a ink jet head, there has been known a process, for example, for forming an ink flow path comprising forming a trench for forming a fine ink flow path on a plate of glass, a metal or the like using processing means, such as cutting and etching, and then, joining to the plate on which the trench is formed a substrate for an ink jet head furnished with a pressure generating element for ejecting the ink. However, in such a conventional process for manufacturing an ink jet head, when the trench is formed using a cutting process, it is difficult to flatten the internal wall surface of the trench, and since the chip or crack of the plate is easily produced, the product yield is not so high. On the other hand, when the trench is formed by etching, there are disadvantages in that it is difficult to make the etching conditions uniform for all the trenches for forming ink flow path, and the process is complicated causing the rise of manufacturing costs. Therefore, in any of these processing means, it is difficult to routinely fabricate ink jet heads having a uniform ink flow path shape, and the obtained ink jet heads tend to have variation in printing characteristics. Furthermore, when the plate on which the above-described trench for forming an ink flow path is joined to the substrate for the ink jet head on which a pressure generating element for ejecting the ink is provided, it is difficult to align the trench with the pressure generating element. Therefore, the above-described conventional process for manufacturing an ink jet head is not suitable for the mass-production of high-quality ink jet heads.

In order to solve such problems in the prior art, in U.S. Pat. No. 4,450,455, there is proposed a process of forming a discharge port comprising providing a dry film consisting of a photosensitive resin material of a substrate for an ink jet head on which the pressure generating element is formed, forming a trench for forming an ink flow path on the dry film using a photolithographic process, joining a top board, such as a glass sheet to the substrate for the ink jet head on which the trench has been formed using an adhesive or the like, and mechanically cutting the end surfaces of the obtained joined body.

According to this process, since the trench for forming the ink flow path is formed using a photolithographic process, it can be accurately formed, and in addition, since the trench has been formed on the substrate for the ink jet head on which the pressure generating element has been provided, an accurate alignment is not necessarily required, and the substrate for the ink jet head can be easily joined to the top board.

However, even using this process, there are problems wherein (1) the above-described adhesive may drop into the ink flow path when the top board is joined to the substrate for the ink jet head, and the shape of the obtained flow path may be deformed; (2) chips may enter into the ink flow path when the above-described joined body is cut for forming the discharge port, and in this case, the obtained ink jet head may be clogged; and (3) since the portion of the joined body to become the ink flow path is hollowed, a part of the discharge port formed by cutting may be cracked when the joined body is mechanically cut.

As processes of solving such problems, U.S. Pat. Nos. 4,657,631, 5,331,344 and 5,458,254 disclose a process wherein a soluble resin layer is provided in the portion to become the ink flow path, a coating resin layer for forming an ink flow path wall to coat the resin layer of the soluble resin layer in the state wherein the soluble resin layer has been provided, and the above-described soluble resin layer is removed. Thereby, the adhesive does not drop into the portion of the ink flow path, and the shape of the ink flow path can be accurately formed. Further, since the portion to become the ink flow path is filled with the soluble resin when the above-described substrate for the ink jet head on which the ink flow path pattern is provided is cut, the possibility of the entering of chips in the ink flow path, and the occurrence of cracks in a part of the discharge port formed by cutting can be reduced. As the above-described soluble resin, a positive type resist is used in view of the ease of removal. The positive type resist forms patterns utilizing difference in dissolving rates between the exposed portion and the unexposed portion, and in any manufacturing processes, the portion of the ink flow path is dissolved and removed after exposure.

It is described that in these processes, the formation of the coating resin layer for forming the ink flow path wall provided on the ink flow path pattern is performed using so-called solvent coating. Solvent coating is a method of applying a predetermined resin for coating after dissolving in a solvent, and spin coating is a typical example. Spin coating has an advantage that the film thickness can be easily controlled. In a process for manufacturing an ink jet head of a so-called side shooter type especially having a discharge port above an electrothermal conversion member, which is a pressure generating element, among ink jet heads, since the discharge port is formed in the coating resin layer for forming the ink flow path wall, the film thickness of the ink flow path wall becomes a factor to determine the distance between the electrothermal conversion member and the discharge port, which affects discharge characteristics. Therefore, the formation of the coating resin layer for forming the ink flow path wall in the process for manufacturing an ink jet head of the side shooter type is often performed by spin coating. As described above, when the coating resin layer for forming the ink flow path wall is formed by solvent coating, since a positive type resist is provided in the above-described ink flow path pattern as a soluble resin layer, it is required to use a carefully selected solvent of the coating resin for forming the ink flow path wall. Specifically, if the dissolving power of the solvent used in solvent coating is excessively strong, an unexposed portion of the positive type resist soluble in this solvent may be partially dissolved, and in this case, there is a problem in that the deformation of the obtained ink flow path wall is caused.

In order to make the thickness of the film formed on the substrate for the ink jet head by solvent coating represented by the above-described spin coating uniform, it is required to adjust the evaporation rate of the solvent, the adjustment of the viscosity of the solvent, and the like are required. In particular, the film in the field of ink jet heads is formed considerably thicker than the film thickness in the field of normal semiconductors, and it is difficult to make the film thickness uniform unless various film-forming conditions are more closely controlled than the films in the field of semiconductors. Also since the film thickness of the above-described ink flow path pattern affects the discharge characteristics, the control of the evaporation rate and the viscosity significantly affects the yield of ink jet heads. In particular, regarding to the evaporation rate of the solvent, the solvent having a lower evaporation rate can more easily achieve the equalization of the film thickness. However, since such solvents with a low evaporation rate have often high solubility, in the conventional processes of manufacturing ink jet heads, if a solvent having high solubility is used as the solvent for applying the resin when the ink flow path wall is formed, the deformation of the ink flow path wall may occur, the problem of yield may arise, and method does not necessarily lead to the improvement of productivity.

As a method to solve such problems, in Japanese Patent Application Laid-Open No. H8-323985, a process wherein a photosensitive resin layer of an ionizing radiation decomposition type containing crosslinkable structural units is formed in the portion to become an ink flow path; a coating resin layer for forming an ink flow path wall coating the resin layer; and the above-described soluble resin layer is removed; is disclosed. According to this process, since the positive type resist forming the ink flow path is not dissolved by the coating resin forming the ink flow path wall, there is no possibility of the deformation of the ink flow path wall. However, with the advance of ink jet printers in recent years, an ink jet printer is required to stably discharge fine liquid droplets that enable high picture-quality recording, and therefore, a more minute ink jet head must be manufactured. Here, if an ink jet head having a more complicated structure is manufactured using the process described in Japanese Patent Laid-Open No. H8-323985, in the patterning of the ink flow path forming member, there are problems of:

(1) since the distance between crosslinked molecules is short, and the rigidity of the resin rises, cracks may be produced due to solvent shock when an extremely complicated pattern portion is formed;
(2) since the degree of freedom of crosslinking points is limited, the crosslinked density does not elevate, and since the resin is swollen by the developer during development, cracks may be produced due to sharp difference of stress; and
(3) some ink flow path forming members must be baked in the intermolecular crosslinking step at a temperature as high as 180° C. to 200° C. for a long time, and has a problem in the improvement of productivity; and there may also be problems in the narrowed design width of the ink flow path, and in the improvement of productivity.

As described above, in the prior art, there have been problems of difficulty to further improve yield and productivity while forming a highly accurate ink flow path, in the process for manufacturing an ink jet head comprising steps of providing a photosensitive resin layer contributing to the formation of the ink flow path on a substrate for the ink jet head, providing a coating resin layer for forming an ink flow path wall on the photosensitive resin layer, and then, forming the ink flow path by dissolving and removing the photosensitive resin layer in the portion of the ink flow path.

DISCLOSURE OF THE INVENTION

The present invention has been devised in view of the above-described aspects, and provides a process for manufacturing an ink jet head wherein there is no possibility of the deformation of the ink flow path portion even if a solvent having high solubility when a coating resin layer is applied for forming the ink flow path, no cracks are produced due to solvent shock when the ink flow path pattern is developed, and further the ink flow path pattern can be formed at a low temperature in a short time; and an ink jet head manufactured by such a manufacturing process.

The positive type photosensitive resin composition according to the present invention is a positive type photosensitive resin composition comprising a polyacrylate resin having, in the structure, at least a structural unit represented by the following general formula (1):

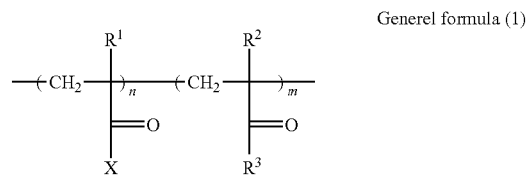

Generel formula (1)

wherein X represents a hydroxyl group, an alkylol group having 2 to 4 carbon atoms, or a methylolamino group; $R^1$ and $R^2$ independently represents a hydrogen atom or an alkyl group having 1 to 3 carbon atoms; $R^3$ represents an alkyl group having 1 to 3 carbon atoms, an alkoxyl group having 1 to 3 carbon atoms, or an aralkyl group having an aryl group or alkyl group with 1 to 2 carbon atoms; n represents a positive integer; and m represents 0 or a positive integer, and a condensable crosslinker.

The process for manufacturing an ink jet head according to the present invention is a process for manufacturing an ink jet head comprising a discharge port for discharging an ink, an ink flow path communicated with the discharge port, and an energy generating element for generating energy for discharging the ink, characterized in that the process comprises:

(1) a step of preparing a substrate provided with an energy generating element;
(2) a step of forming a photosensitive resin layer that can be dissolved and removed so as to cover the energy generating element on the surface of the substrate on which the energy generating element is provided;
(3) a step of patterning the photosensitive resin layer to form an ink flow path pattern;
(4) a step of forming a coating resin layer for forming the wall of the ink flow path on the ink flow path pattern;
(5) a step of forming an ink discharge port in the coating resin layer located on the energy generating element; and
(6) a step of dissolving and removing the ink flow path pattern to form the ink flow path communicated with the discharge port; and the process employs a positive type photosensitive resin composition comprising at least a structural unit represented by the following general formula (1):

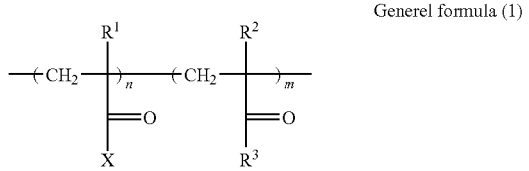

Generel formula (1)

wherein X represents a hydroxyl group, an alkylol group having 2 to 4 carbon atoms, or a methylolamino group; $R^1$ and $R^2$ independently represents a hydrogen atom, or an alkyl group having 1 to 3 carbon atoms; $R^3$ represents an alkyl group having 1 to 3 carbon atoms, an alkoxyl group having 1 to 3 carbon atoms, or an aralkyl group having an aryl group or alkyl group with 1 to 2 carbon atoms; n represents a positive integer; m represents 0 or a positive integer, and $R^1$ to $R^3$ have independently the above-described meanings in each unit, and a condensable crosslinker represented by the following general formula (2):

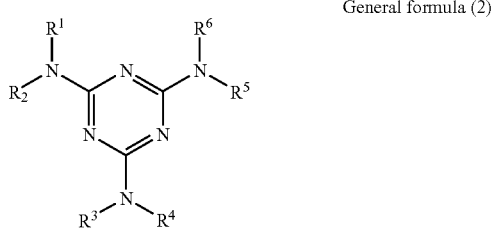

General formula (2)

wherein $R^1$ to $R^6$ independently represents a hydrogen atom, a methylol group, or an alkoxymethyl group to which an alkoxy group having 1 to 4 carbon atoms is bonded; provided that at least two of $R^1$ to $R^6$ represent methylol groups, or alkoxymethyl groups to which an alkoxy group having 1 to 4 carbon atoms is bonded, and $R^1$ to $R^6$ have independently the above-described meanings in each unit.

The ink jet head according to the present invention is characterized in that the ink jet head is manufactured using the above-described process for manufacturing an ink jet head.

According to the process for manufacturing an ink jet head of the present invention, a high-quality ink jet head can be obtained even if a solvent having high solubility is used when the ink flow path pattern is formed.

BEST MODE FOR CARRYING OUT THE INVENTION

Figure 1:
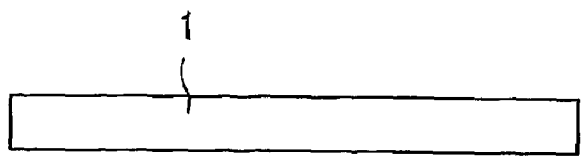
FIG. 1 is a sectional view of a substrate.

In the positive type photosensitive resin composition used in the present invention, since the intermolecular crosslinking reaction of the polyacrylate resin proceeds by heating after applying, the molecular weight of the resin in the state of a film increases, and solvent resistance is improved. Furthermore, since the positive type molecular disintegration reaction of the main chain decomposition type proceeds by the irradiation of ionizing radiation to the crosslinked resin film through a mask, patterning can be performed. Since the main chain decomposition type molecular disintegration reaction proceeds by the irradiation of ionizing radiation to the resin layer after patterning to form a low-molecular compound, dissolution and removal can be performed.

Furthermore, the positive type photosensitive resin composition can contain at least one photoacid generator selected from the group consisting of aromatic sulfonium salts, aromatic iodonium salts, and triazine compounds, and in this case, the main chain decomposition type molecular disintegration reaction by the irradiation of ionizing radiation and the decomposition reaction of the crosslinked site by the acid generated by the irradiation of ionizing radiation proceed simultaneously. Therefore, it can be used as a higher sensitivity positive type photosensitive resin composition.

Specifically, in the present invention, since the intermolecular crosslinking reaction through a crosslinker proceeds by heating, and thereafter, by using a photosensitive resin composition wherein a positive type decomposition reaction proceeds by the irradiation of ionizing radiation, the above-described ink flow path pattern can be decomposed after forming the ink flow path pattern, the cleaning of the ink flow path pattern can be extremely easily performed in a short time. In the ink flow path pattern formed by the above-described process, since solvent resistance is significantly improved due to the intermolecular crosslinking reaction through the crosslinker, even in the case wherein the coating resin for forming the ink flow path wall is applied using a solvent coating after forming the ink flow path pattern, the deformation of the ink flow path pattern is not caused. Since the crosslinking reaction is the intermolecular crosslinking through a crosslinker, the crosslinking reaction proceeds at a low temperature in a short time, and in addition, the toughness of the resin after crosslinking is extremely high in comparison with the case wherein molecules are directly crosslinked, and cracks due to solvent shock is difficult to occur. Furthermore, as the developer of the photosensitive resin, a developer that can dissolve the exposed portion, and is difficult to dissolve the unexposed portion, and causes no cracks by solvent shock even when a minute pattern of a complicated structure is formed is required; however, after keen examinations, the present inventor found that as a developer satisfying the above characteristics the developer containing glycol ether having a carbon number of 6 or more that can be mixed with water in optional ratios, a nitrogen-containing basic organic solvent, and water can be especially preferably used. As the glycol ether, ethylene glycol monobutyl ether and/or diethylene glycol monobutyl ether; as the nitrogen-containing basic organic solvent, ethanol amine and/or morphorin are preferably used. For example, as the developer for PMMA (polymethyl methacrylate) used as the resist in X-ray lithography, the developer disclosed in Japanese Patent Laid-Open No. 3-10089 can be preferably used also in the present invention.

In addition, since the resin can be easily dissolved and removed, this is a large advantage when a minuter orifice is formed.

Although preferable specific examples of polyacrylate resins having the structural unit represented by the general formula (1) include copolymers having the following units, they are not limited thereto. Since the polyacrylate resins have a tendency that if the molecular weight is low, the film forming properties are poor, and if the molecular weight is high, the sensitivity lowers, a weight average molecular weight (Mw) of about 20,000 to 200,000 is preferred.

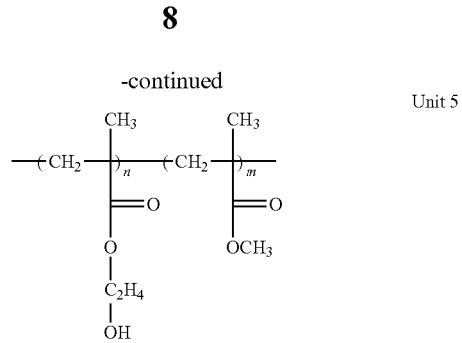

Unit 5

(In the formulas, m and n represent positive integers.)

Although preferable specific examples of condensing crosslinkers represented by the general formula (2) include the following melamine compounds and the partially condensation products of the melamine compounds, they are not limited thereto. If the adding quantity of the melamine compounds and the partially condensation products thereof is small, the crosslinked density is low, and film thinning occurs in the unexposed portion during development; and if the adding quantity is large, the crosslinked density tends to elevate excessively and the sensitivity lowers; therefore, the adding quantity is preferably 10 to 30% by weight to the polyacrylate resin.

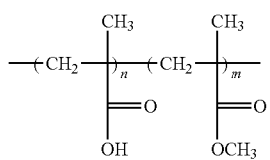

Unit 1

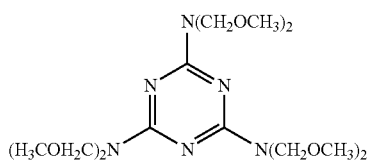

Compound 6

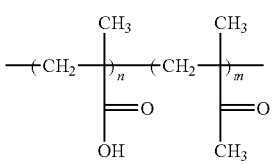

Unit 2

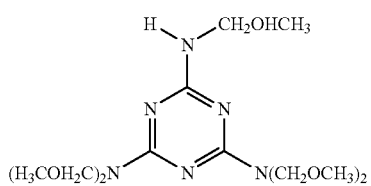

Compound 7

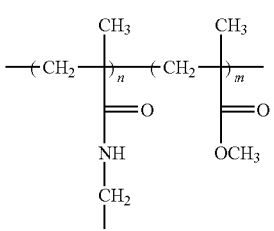

Unit 3

Furthermore, the positive type photosensitive resin composition can contain at least one photoacid generator selected from the group consisting of aromatic sulfonium salts, aromatic iodonium salts, and triazine compounds. As the photoacid generator, for example, as aromatic sulfonium salts, TPS-102, 103, 105, MDS-103, 105, 205, 305, DTS-102, 103 marketed by Midori Chemical Co., Ltd., SP-170, 172 and the like marketed by Asahi Denka Kogyo K. K.; as aromatic iodonium salts, DPI-105, MPI-103, 105, BBI-101, 102, 103, 105 and the like marketed by Midori Chemical Co., Ltd.; and as triazine compounds, TAZ-101, 102, 103, 104, 105, 106, 107, 110, 111, 113, 114, 118, 119, 120 and the like marketed by Midori Chemical Co., Ltd. can be preferably used. Although the adding quantity can be optionally selected to achieve the target sensitivity, it is especially preferable within the range between 1 and 7% by weight to the polyacrylate resin.

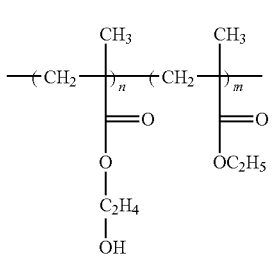

Unit 4

According to the present invention, since the solvent resistance of the resin in the ink flow path pattern portion is significantly improved by the crosslinking reaction through the crosslinker when the ink flow path pattern is formed, there is no possibility of the deformation of the ink flow path, even if the coating resin for forming the ink flow path wall is applied by a solvent coating using a solvent having high solubility. Therefore, the uniformity of the thickness of the ink flow path pattern can be easily achieved, and an ink jet head having a highly accurate ink flow path can be provided. In addition, there are no limitations on the solvents used for applying coating resin for forming the ink flow path wall, and as a result, the coating resin materials that have not been used can be used, and the options of the coating resin materials and solvents of the coating resin for forming the ink flow path wall increase. Furthermore, when an ink jet head having a minute structure that can discharge fine droplets, in addition to the effect to elevate toughness of the resin for the ink flow path by intermolecular crosslinking through the crosslinker, there is no possibility of cracking due to solvent shock in the development of a minute pattern having an especially complicated structure by the optimization of the developer, and as a result, an ink jet head free from the deformation of the ink flow path can be manufactured.

The present invention will be described in further detail below referring to the drawings. FIGS. 1 to 8 are schematically shown sectional views for illustrating an example of the constitution of an ink jet head according to the present invention, and the process of the manufacture thereof.

First, in the present invention, a substrate 1 consisting of glass, ceramics, plastics, metals and the like, for example, as shown in FIG. 1 is used. Such a substrate 1 can be used without specific limitation in the shapes, materials or the like thereof as long as the substrate can function as a part of the liquid flow path constituent member, and can function as the supporting body of the material layer for forming an ink flow path and ink discharge ports as described below.

Figure 2:
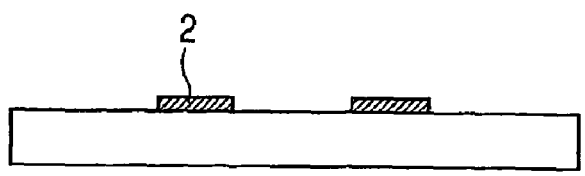
FIG. 2 is a sectional view of a substrate on which an ink discharge pressure generating element is formed.

On the above-described substrate 1, a desired number of ink discharge pressure generating elements 2, such as electrothermal conversion elements, piezoelectric elements or the like are disposed (FIG. 2). By such ink discharge pressure generating elements 2, discharge energy for discharging recording liquid droplets is supplied to an ink solution, and recording is performed. For example, when electrothermal conversion elements are used as the above-described ink discharge pressure generating elements 2, these elements heat the nearby recording solution to create change in the recording solution and generate discharge energy. Also for example, when piezoelectric elements are used, the mechanical oscillation of the elements generates discharge energy.

To these discharge pressure generating elements 2, electrodes (not shown) for inputting control signals to operate the elements are connected. In general, although various functional layers, such as a protective layer (not shown), are provided in order to improve the durability of these discharge pressure generating elements 2, there is of course no harm to provide these functional layers in the present invention.

Figure 3:
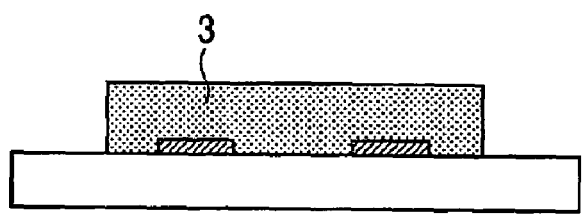
FIG. 3 is a sectional view of a substrate on which a flow path pattern is formed.

Next, as FIG. 3 shows, an ink flow path pattern 3 is formed using a soluble resin on the substrate 1 including the above-described ink discharge pressure generating elements 2. The most general means include a means to form the pattern by a photosensitive material. The pattern formed of the photosensitive material must be easily dissolved and removed. In the positive type photosensitive resin composition used in the present invention, the intermolecular crosslinking reaction of polyacrylate resin proceeds through the crosslinker by heating after applying, the solvent resistance in subsequent steps is improved, and on the other hand, the crosslinked resin film can be patterned using the positive reaction by exposure through a mask. At this time, since the photosensitive resin composition is undergone intermolecular crosslinking through the crosslinker, the toughness is extremely high, and cracks due to solvent shock during development can be suppressed compared with the case wherein molecules themselves are directly crosslinked. Furthermore, the molecules of the resin layer in the unexposed portion after patterning are decayed by the irradiation of ionizing radiation in a subsequent step to form a low-molecular compound, and the solvent can be removed. In the present invention, therefore, by using the positive type photosensitive resin composition according to the present invention in the portion to become the ink flow path, the above-described ink flow path pattern can be decomposed through the ionizing radiation irradiation step after forming the ink flow path pattern, and cleaning in the final step can be performed in an extremely short time. Furthermore, when the ink flow path pattern is formed, since the resin in the portion of the ink flow path pattern is made insoluble by the thermal crosslinking reaction, the deformation of the ink flow path can not be caused even if the coating resin layer for forming the ink flow path wall is formed using a solvent having high solubility. Therefore, the uniformity of the thickness of the ink flow path pattern can be easily achieved. In addition, crosslinking can be performed at a low temperature in a short time in the step of thermal crosslinking, leading to the improvement of productivity.

In the present invention, if the positive type photosensitive resin composition used in the ink flow path pattern is patterned at least on the upper layer directly connected to the nozzle when the nozzle constituent member is applied, there is no problem if the ink flow path pattern is constituted, for example, by two layers for constituting a three-dimensional flow path that can discharge fine liquid droplets. This is because the portion where the deformation of the ink flow path causes a problem is mainly the portion that falls under the root of the nozzle, and stable discharge can be performed if the deformation of this portion can be suppressed. In this case, however, as the resin for forming the lower layer ink flow path pattern, it is desirable to use a positive type resist causing the positive type molecular disintegration reaction by the irradiation of ionizing radiation, and the resist is dissolved and removed together with the upper layer in the subsequent step. In this case, as the resist for forming the lower layer ink flow path pattern, a resist having a sensitivity to the light of a different wavelength from the sensitivity of the upper layer resist is used, and especially, polymethyl isopropenyl ketone (PMIPK) is preferably used.

The positive type photosensitive resin compositions that satisfy the above properties include, a photosensitive resin composition containing a polyacrylate resin having the structural unit represented by the general formula (1), and at least one selected from the group consisting of a melamine compound represented by the general formula (2) and the condensation product thereof. Also, the photosensitive resin composition may further contain at least one selected from the group consisting of aromatic sulfonium salts, aromatic iodonium salts, and triazine compounds.

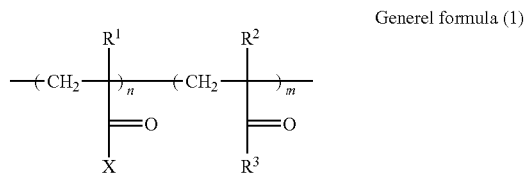

Generel formula (1)

(In the formula, X represents a hydroxyl group, an alkylol group having 2 to 4 carbon atoms, or a methylolamino group; $R^1$ and $R^2$ independently represents a hydrogen atom, or an alkyl group having 1 to 3 carbon atoms; $R^3$ represents an alkyl group having 1 to 3 carbon atoms, an alkoxyl group having 1 to 3 carbon atoms, or an aralkyl group having an aryl group or alkyl group with 1 to 2 carbon atoms; n represents a positive integer; and m represents 0 or a positive integer.)

General formula (2)

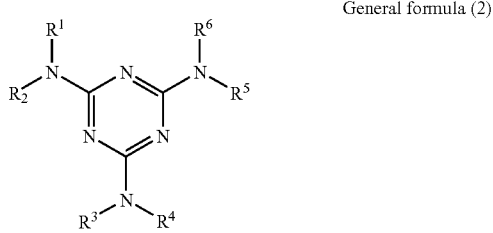

(In the formula, $R^1$ to $R^6$ independently represents a hydrogen atom, a methylol group, or an alkoxymethyl group to which an alkoxy group having 1 to 4 carbon atoms is bonded; provided that at least two of $R^1$ to $R^6$ represent methylol groups, or alkoxymethyl groups to which an alkoxy group having 1 to 4 carbon atoms is bonded.)

Figure 4:
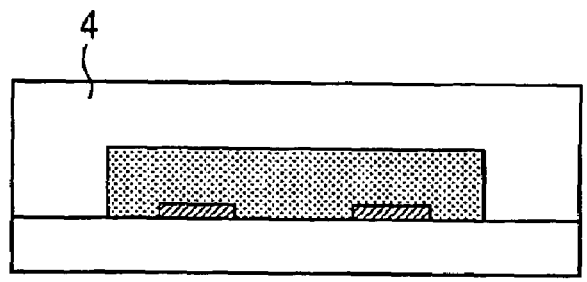
FIG. 4 is a sectional view of a substrate on which a nozzle constituent member is formed.

On the substrate 1 on which the flow path pattern 3 is thus formed, a nozzle constituent member 4 is formed as FIG. 4 shows using a method, such as conventional spin coating, roll coating and slit coating. As the nozzle constituent member 4, a photosensitive member is preferred because an ink discharge port 6 as described later can be easily and accurately formed by photolithography. For such a photosensitive nozzle constituent member, high mechanical strength as a constituent material adhesiveness to the base material, ink resistance, as well as resolution for patterning minute pattern of the ink discharge port are required. As a material that satisfies these characteristics, a cationically polymerizable epoxy resin composition can be preferably used.

Epoxy resins used in the present invention include, for example, a reaction product of bisphenol-A and epichlorohydrin that has a molecular weight of about 900 or more, a reaction product of bromine-containing bisphenol-A and epichlorohydrin, a reaction product of phenol novolak or o-cresol novolak and epichlorohydrin, polyfunctional epoxy resins having oxycyclohexane skeleton described in Japanese Patent Laid-Open Nos. S60-161073, S63-221121, S64-9216 and H2-140219, but not limited to these compounds.

In the above-described epoxy compounds, the compounds having an epoxy equivalent of preferably 2,000 or less, more preferably 1,000 or less can be used. This is because the epoxy equivalent exceeds 2,000, the crosslinking density lowers in the curing reaction, and problems in adhesiveness and ink resistance may arise.

In addition, because of cationically polymerizable resin compositions, an ink discharge port 6 described later can be easily and accurately formed by photolithography while satisfying high mechanical strength, adhesiveness to the base material, ink resistance, as well as resolution for patterning minute pattern of the ink discharge port.

As a cationic photopolymerization initiator for curing the above-described resin, aromatic iodonium salts, aromatic sulfonium salts [refer to J. POLYMER SCI.: Symposium No. 56, pp. 385-395 (1976)], and SP-150 and SP-170 marketed by Asahi Denka Kogyo K. K.

The above-described cationic photopolymerization initiator can accelerate cationic polymerization by using in combination with a reducing agent and heating (crosslinked density is improved compared with single cationic photopolymerization). However, when the cationic photopolymerization initiator is used in combination with a reducing agent, the reducing agent must be selected so as to be a so-called redox type initiator system, which does not react at normal temperature, but reacts at a certain temperature or above (preferably 60° C. or above). As such a reducing agent, a copper compound, in particular, considering the reactivity and the solubility in the epoxy resin, copper triflate (copper (II) trifluoromethane sulfonate) is most suitable. Furthermore, additives or the like can be arbitrarily added to the above-described composition as required. For example, a flexibility imparting agent can be added for lowering the elastic modulus of the resin; or a silane coupling agent can be added for achieving further adhesiveness to the underlying substrate.

Figure 5:
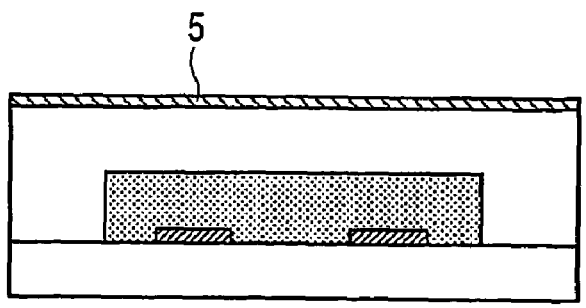
FIG. 5 is a sectional view of a substrate on which an ink repellent agent layer is formed.

Next, an ink repellent agent layer 5 having photosensitivity is formed on the nozzle constituent member 4 (FIG. 5). Although the ink repellent agent layer 5 can be formed using a coating method, such as spin coating, roll coating and slit coating, since the ink repellent agent layer 5 is formed on the uncured nozzle constituent member 4, it is required that they are not miscible to each other more than required. Also as described above, when a cationically polymerizable chemical composition is used as the nozzle constituent member 4, it is preferable that cationically polymerizable functional groups are also contained in the ink repellent agent layer 5 having photosensitivity. Although the nozzle constituent member 4 contains a photopolymerization initiator as an essential component, the ink repellent agent layer 5 is not necessarily required to contain the photopolymerization initiator, and reaction and curing can be performed using a polymerization initiator produced when the nozzle material is cured.

Figure 6:
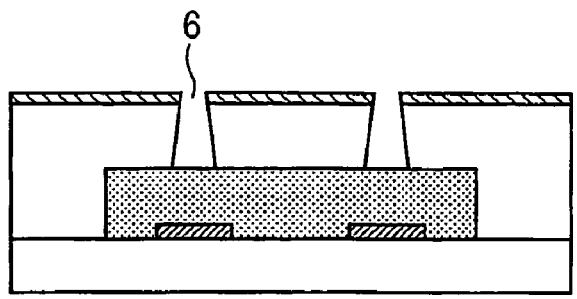
FIG. 6 is a sectional view of a substrate on which an ink discharge port is formed.

Next, pattern exposure is performed through a mask (not shown) and a developing treatment is performed to form ink discharge ports 6 (FIG. 6). By developing the pattern-exposed nozzle constituent member 4 and ink repellent agent layer 5 using an adequate solvent, the ink discharge ports 6 can be formed as FIG. 6 shows.

Figure 7:
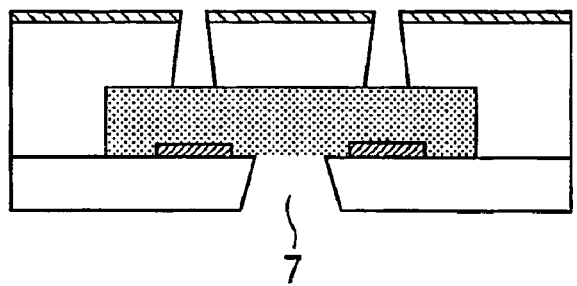
FIG. 7 is a sectional view of a substrate on which an ink supply port is formed.

Next, an ink supply port 7 is formed (FIG. 7). As the method for forming the ink supply port 7, a method using excimer laser, a method using sand blasting, a method using etching or the like can be arbitrarily used.

Figure 8:
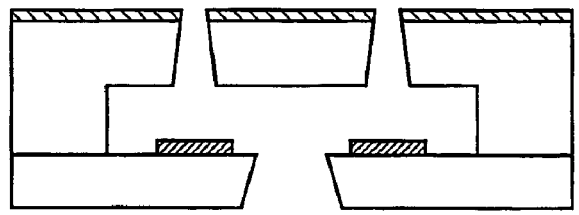
FIG. 8 is a sectional view of a completed ink jet head.

Then, after a cutting and separating step (not shown), ionizing radiation is radiated onto the substrate to be processed to make the ink flow path pattern 3 soluble, and the ink flow path pattern 3 is dissolved and removed. By performing heat treatment as required, the nozzle constituent member 4 and the ink repellent agent layer 5 are completely cured. Further, members for ink supply (not shown) are joined, and electrical joint for driving the ink discharge pressure generating element (not shown) is performed to complete the ink jet head (FIG. 8).

The examples will be shown below, and the present invention will be described in further detail.

EXAMPLE 1

In this example, an ink jet head was fabricated and evaluated in accordance with procedures shown in the above-described FIGS. 1 to 8. First, a silicon substrate 1 having an electrothermal conversion member (heater consisting of $HfB_2$) as an ink discharge pressure generating element 2, and a laminated film of SiN+Ta (not shown) in the ink flow path and the nozzle-forming site was prepared (FIG. 2). Next, a positive type photosensitive resin composition layer was formed on the substrate to be processed to form a flow path pattern 3 (FIG. 3). As the photosensitive resin composition, a resin prepared by adding 3 mol % of hexamethoxymethyl melamine (NIKALAC MW-100L manufactured by Sanwa Chemical Co., Ltd.) as a crosslinker to the following copolymer of methacrylic acid and methyl methacrylate (methacrylic acid: methyl methacrylate=20:80, (mass ratio). Compound 8), was used.

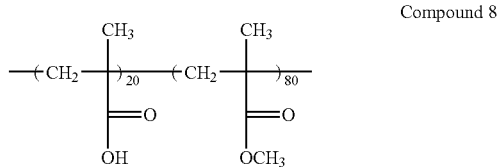

Compound 8

Weight average molecular weight (Mw: polystyrene converted)=100000

Degree of dispersion (Mw/Mn)=2.5

This resin powder was dissolved in cyclohexanone at a solid concentration of about 30% by weight, and used as a resist solution. The resist solution was applied using a spin coating, and after pre-baking at 100° C. for 3 minutes, baking was performed in an oven at 150° C. for 30 minutes. By this curing, a thermal crosslinking reaction by the crosslinker proceeded. The film thickness of the resist layer after heat treatment was 15 μm. Thereafter, the resist layer was exposed using UV beams of wave lengths of 200 to 280 nm at an exposure of 50,000 mJ/m², developed using a developer of the following composition, and a lines treatment was performed using isopropyl alcohol to obtain an ink flow path 3.

<Developer>
  Diethylene glycol raonobutyl ether: 60% by volume
  Ethanol amine: 5% by volume
  Morpholine: 20% by volume
  Ion exchanged water: 15% by volume Next, a photosensitive resin composition consisting of the following composition was spin-coated on a substrate to be processed (film thickness of flat plate 20 μm), and baked at 100° C. for 2 minutes (hot plate) to form a nozzle constituent member 4 (FIG. 4).

<Photosensitive Resin Composition>
  Epoxy resin: EHPE (manufactured by Daicel Chemical Industries, Ltd.): 100 parts by weight
  Additive: 1,4-HFAB (manufactured by Central Glass Co., Ltd.): 20 parts by weight
  Cationic photopolymerizable chemical composition: SP-170 (manufactured by Asahi Denka Kogyo K.K.): 2 parts by weight
  Silane coupling agent: A-187 (manufactured by Nippon Unicar Co., Ltd.): 5 parts by weight
  Methyl isobutyl ketone: 100 parts by weight
  Diglyme: 100 parts by weight Then, a photosensitive resin composition consisting of the following composition was spin-coated on a substrate to be processed to be a film thickness of 1 μm, and baked at 80° C. for 3 minutes (hot plate) to form an ink repellent agent layer 5 (FIG. 5).

<Ink Repellent Agent Layer>
  EHPE-3158 (manufactured by Daicel Chemical Industries, Ltd.): 35 parts by weight
  2,2-bis (4-glycidyl oxyphenyl) hexafluoropropane: 25 parts by weight
  1,4-bis (2-hydroxy hexafluoroisopropyl) benzene: 25 parts by weight
  3-(2-perfluorohexyl) ethoxy-1,2-epoxypropane: 16 parts by weight
  A-187 (manufactured by Nippon Unicar Co., Ltd.): 4 parts by weight
  SP-170 (manufactured by Asahi Denka Kogyo K.K.): 2 parts by weight
  Diethylene glycol monoethyl ether: 100 parts by weight Next, the patterning of the nozzle constituent member 4 and the ink repellent agent layer 5 is performed to form an ink discharge port (FIG. 6). In this example, a discharge port pattern of a diameter of 15 μm was formed.

Next, an etching mask was formed using a polyether amide resin composition (HIMAL, manufactured by Hitachi Chemical Co., Ltd.) on the back surface of the substrate to be processed, and the anisotropic etching of the silicon substrate was performed using a known technique disclosed in Japanese Patent Laid-Open No. H5-124199 to form an ink supply port 7 (FIG. 7). At this time, in order to protect the ink repellent agent layer 5 from the etchant, a protective film (OBC, manufactured by Tokyo Ohka Kogyo Co., Ltd.) was applied on the ink repellent agent layer 5.

Next, after dissolving and removing OBC used as the protective film using xylene, overall exposure was performed through the nozzle constituent member and the ink repellent agent layer using the light of wave lengths of 200 to 280 nm at an exposure of 50,000 mJ/cm² to make the ink flow path pattern soluble. Then, by immersing the substrate in methyl lactate while supplying ultrasonic waves to dissolve and remove the flow path pattern 3, an ink jet head was fabricated (FIG. 8).

In order to check the quality of thus fabricated ink jet head, the shape of the ink flow path was observed through a microscope. Since all the ink flow path patterns used in this example are colorless and transparent, the shape of the ink flow path can be observed through the ink flow path pattern. As a result, no deformation of the shape of the ink flow path was observed. Furthermore, when the ink jet head was mounted on a recorder, and printing was performed using an ink consisting of pure water/glycerin/direct black 154 (water-soluble black dye)=65/30/5, stable printing could be performed.

EXAMPLE 2

Figure 9:
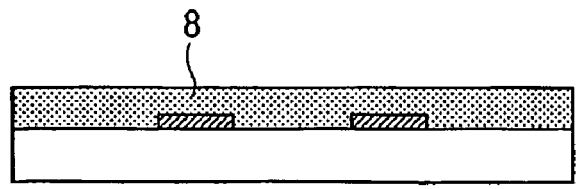
FIG. 9 is a sectional view of a substrate on which a first positive type resist layer is formed.
Figure 10:
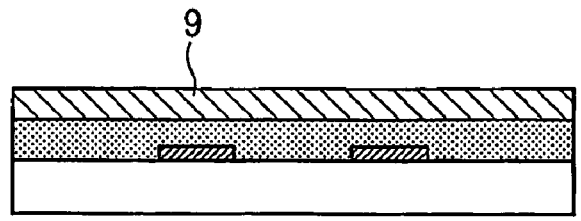
FIG. 10 is a sectional view of a substrate on which a second positive type resist layer is formed.

An ink jet head was fabricated in accordance with steps shown in FIGS. 9 to 17. In the same manner as Example 1, a first positive type resist layer 8 was formed on a substrate including an ink discharge pressure generating element 2 (FIG. 9). As the first positive type resist, polymethyl isopropenyl ketone (ODUR manufactured by Tokyo Ohka Kogyo Co., Ltd.) was used. The first positive type resist solution was applied using a spin coating, and baked at 120° C. for 3 minutes. The film thickness of the resist layer after heat treatment was 10 μm. Then, a second positive type resist layer 8 was formed (FIG. 10). As the second positive type resist, a resin wherein 3 mol % of hexamethoxy melamine (NIKALAC MW-100L manufactured by Sanwa Chemical Co. Ltd.) was added as a crosslinker to a copolymer of methacrylic acid and methyl methacrylate (methacrylic acid:methyl methacrylate=20:80, Compound 8) was used.

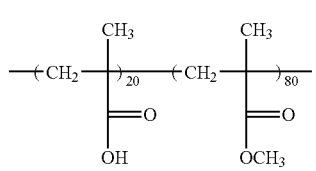

Compound 8

Weight average molecular weight (MW: polystyrene converted)=100000

Degree of dispersion (Mw/Mn)=2.5

This resin was dissolved in cyclohexanone at a solid concentration of about 30% by weight, and used as a resist solution. The resist solution was applied using a spin coating, and after pre-baking at 120° C. for 3 minutes, baking was performed in an oven in a nitrogen atmosphere at 140° C. for 30 minutes. The film thickness of the resist layer after heat treatment was 10 μm.

Figure 11:
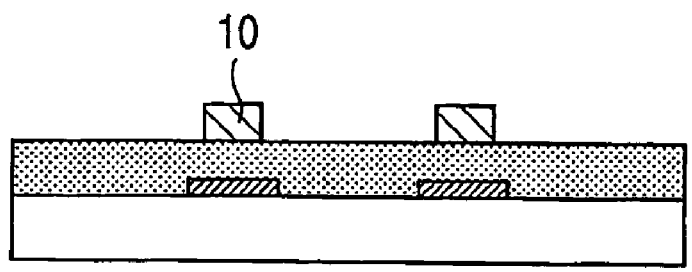
FIG. 11 is a sectional view of a substrate on which a second flow path pattern is formed.

Then, the patterning of the second positive type resist layer was performed. Pattern exposure was performed using a deep-UV exposure apparatus UX-3000 manufactured by Ushio, Inc. equipped with an optical filter to cut off wavelengths of 270 nm or longer as an exposure apparatus, at an exposure of 20000 mJ/cm$^2$, and the pattern was developed using the developer of the following composition, and the rinse treatment was performed using isopropyl alcohol to form a second flow path pattern 10 (FIG. 11).

<Developer>

Diethylene glycol monobutyl ether: 60% by volume

Ethanol amine: 5% by volume

Morpholine: 20% by volume

Ion exchanged water: 15% by volume

Figure 12:
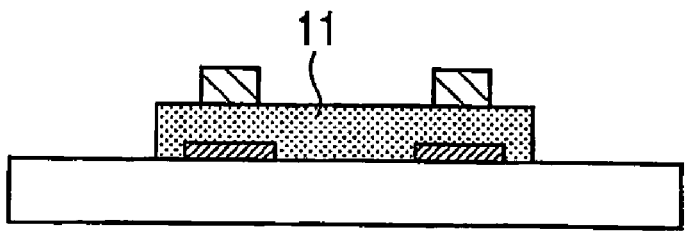
FIG. 12 is a sectional view of a substrate on which a first flow path pattern is formed.
Figure 13:
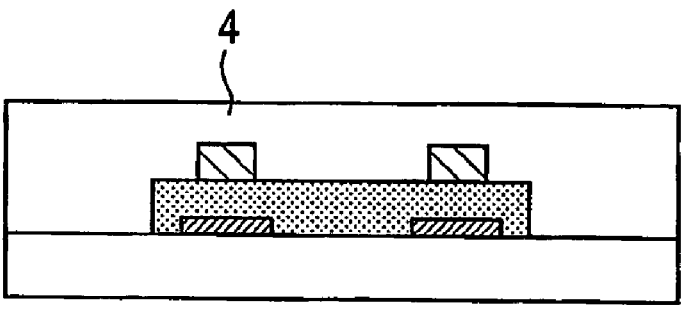
FIG. 13 is a sectional view of a substrate on which a nozzle constituent member is formed.
Figure 14:
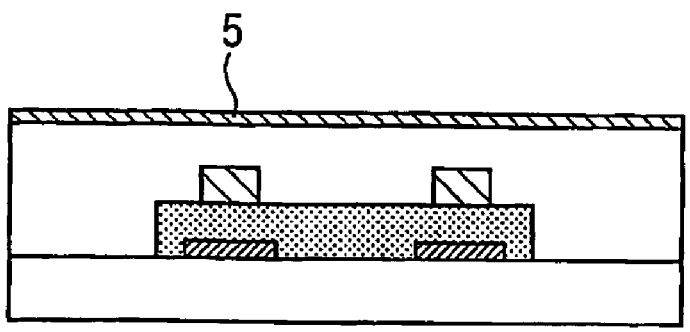
FIG. 14 is a sectional view of a substrate on which an ink repellent agent layer is formed.

Next, the patterning of the first positive type resist layer was performed. Pattern exposure was performed using the same exposure apparatus as described above, equipped with an optical filter to cut off wavelengths of 260 nm or shorter, at an exposure of 5000 mJ/cm$^2$, and the pattern was developed using methyl isobutyl ketone, and the rinse treatment was performed using isopropyl alcohol to form a first flow path pattern 11 (FIG. 12).

Figure 15:
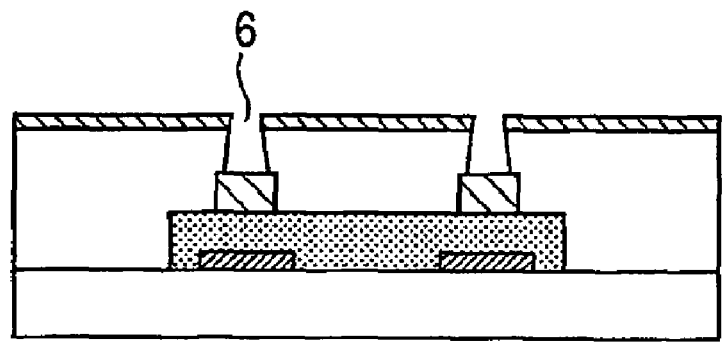
FIG. 15 is a sectional view of a substrate on which an ink discharge port is formed.

Next, in the same manner as in Example 1, a nozzle constituent member 4 (FIG. 13) and an ink repellent agent layer 5 (FIG. 14) were formed on the substrate to be processed, and pattern exposure was performed to form ink discharge ports 6 (FIG. 15). In this example, the discharge port patterns of a diameter of 10 μm were formed.

Figure 16:
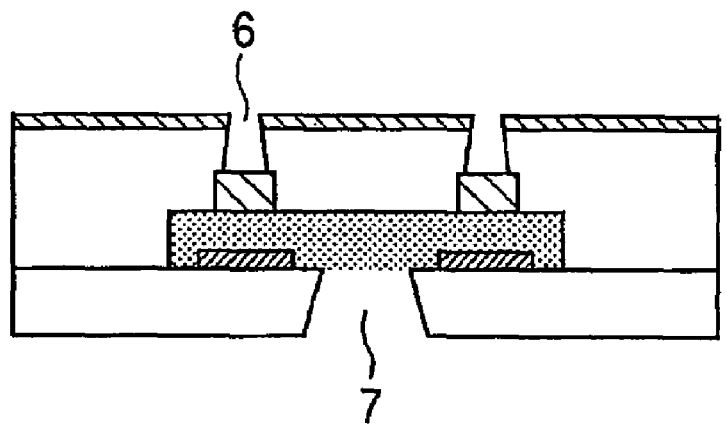
FIG. 16 is a sectional view of a substrate on which an ink supply port is formed.
Figure 17:
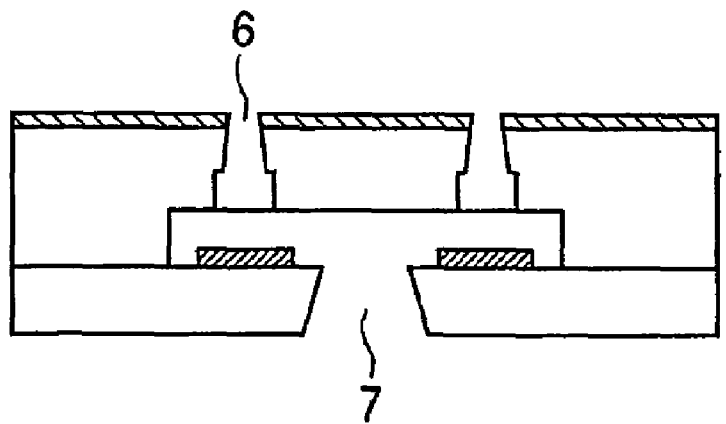
FIG. 17 is a sectional view of a completed ink jet head.

Next, in the same manner as in Example 1, an ink supply port 7 was formed using anisotropic etching (FIG. 16). Then, flood exposure was performed through the nozzle constituent member and the ink repellent agent layer using the same exposure apparatus as described above, without mounting optical filters, at an exposure of 20000 mJ/cm$^2$ to make the flow path patterns 10 and 11 soluble. Then, the substrate was immersed in methyl lactate while supplying ultrasonic waves, and the flow path patterns 10 and 11 were dissolved and removed to fabricate an ink jet head (FIG. 17).

In the same manner as in Example 1, the shape of the ink flow path was observed through a microscope. As a result, no deformation of the shape of the ink flow path was observed. Furthermore, when printing was performed in the same manner as in Example 1, stable printing could be performed.

EXAMPLE 3

In the same manner as in Example 1, a resin wherein 3 mol % to 2-hydroxyethyl methacrylate of pentamethoxy melamine (NIKALAC MX-750LM, manufactured by Sanwa Chemical Co., Ltd.) was added as a crosslinker to a copolymer of 2-hydroxyethyl methacrylate and methyl methacrylate (2-hydroxyethyl methacrylate: methyl methacrylate=20:80, Compound 9) was used as a photosensitive resin composition on a substrate on which an electrothermal conversion element is formed.

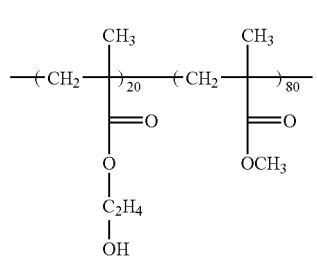

Compound 9

Weight average molecular weight (Mw: polystyrene converted)=80000

Degree of dispersion (Mw/Mn)=2.2

Under the same conditions as in Example 1, an ink flow path pattern layer was applied and patterned, and finally the resin forming the ink flow path pattern was dissolved to fabricate an ink jet head. In the same manner as in Example 1, the shape of the ink flow path was observed through a microscope. As a result, no deformation of the shape of the ink flow path was observed. Furthermore, when printing was performed in the same manner as in Example 1, stable printing could be performed.

EXAMPLE 4

In the same manner as in Example 2, a resin wherein 3 mol % to 2-hydroxyethyl methacrylate of pentamethoxy melamine (NIKALAC MX-750LM, manufactured by Sanwa Chemical Co., Ltd.) was added as a crosslinker to a copolymer of 2-hydroxyethyl methacrylate and methyl methacrylate (2-hydroxyethyl methacrylate:methyl methacrylate=20:80, Compound 9) was used as a second positive type resist on a substrate on which an electrothermal conversion element is formed.

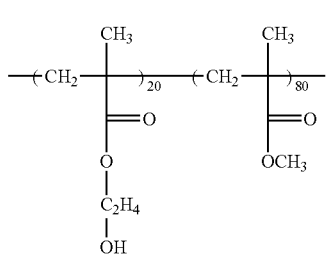

Compound 9

Weight average molecular weight (Mw: polystyrene converted)=80000

Degree of dispersion (Mw/Mn)=2.2

Under the same conditions as in Example 2, each of first and second ink flow path pattern layers was applied and patterned, and finally the resin forming the ink flow path pattern was dissolved to fabricate an ink jet head. In the same manner as in Example 1, the shape of the ink flow path was observed through a microscope. As a result, no deformation of the shape of the ink flow path was observed. Furthermore, when printing was performed in the same manner as in Example 1, stable printing could be performed.

EXAMPLE 5

An ink jet head was manufactured in the same manner as in Example 1 except that to the positive type photosensitive resin composition, 2 parts by weight of SP-172 (manufactured by Asahi Denka Kogyou K.K.) was added to the resin as a photoacid generator, the exposure for patterning was halved, and a treatment at 100° C. for 180 seconds was performed on a hot plate as PEB.

In the same manner as in Example 1, the shape of the ink flow path was observed through a microscope. As a result, no deformation of the shape of the ink flow path was observed. Furthermore, when printing was performed in the same manner as in Example 1, stable printing could be performed.

EXAMPLE 6

An ink jet head was manufactured in the same manner as in Example 2 except that to the second positive type resist, 2 parts by weight of SP-172 (manufactured by Asahi Denka Kogyou K.K.) was added to the resin as a photoacid generator, the exposure for patterning was halved, and a treatment at 100° C. for 180 seconds was performed on a hot plate as PEB. In the same manner as in Example 1, the shape of the ink flow path was observed through a microscope. As a result, no deformation of the shape of the ink flow path was observed. Furthermore, when printing was performed in the same manner as in Example 1, stable printing could be performed.

EXAMPLE 7

An ink jet head was manufactured in the same manner as in Example 3 except that to the positive type photosensitive resin composition, 2 parts by weight of SP-172 (manufactured by Asahi Denka Kogyou K.K.) was added to the resin as a photoacid generator, the exposure for patterning was halved, and a treatment at 100° C. for 180 seconds was performed on a hot plate as PEB. In the same manner as in Example 1, the shape of the ink flow path was observed through a microscope. As a result, no deformation of the shape of the ink flow path was observed. Furthermore, when printing was performed in the same manner as in Example 1, stable printing could be performed.

EXAMPLE 8

An ink jet head was manufactured in the same manner as in Example 4 except that to the second positive type resist, 2 parts by weight of SP-172 (manufactured by Asahi Denka Kogyou K.K.) was added to the resin as a photoacid generator, the exposure for patterning was halved, and a treatment at 100° C. for 180 seconds was performed on a hot plate as PEB. In the same manner as in Example 1, the shape of the ink flow path was observed through a microscope. As a result, no deformation of the shape of the ink flow path was observed. Furthermore, when printing was performed in the same manner as in Example 1, stable printing could be performed.

COMPARATIVE EXAMPLE 1

In the same manner as in Example 1, a copolymer of methacrylic acid and methyl methacrylate was used as a photosensitive resin composition to a substrate on which an electrothermal conversion element is formed.

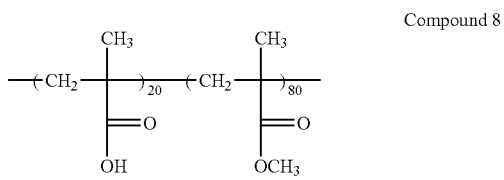

Compound 8

Weight average molecular weight (Mw: polystyrene converted)=40000

Degree of dispersion (Mw/Mn)=2.5

This resin was dissolved in cyclohexanone at a solid concentration of about 30% by weight, and used as a resist solution. The resist solution was applied using a spin coating, and after pre-baking at 120° C. for 3 minutes, baking was performed in an oven in a nitrogen atmosphere at 140° C. for 30 minutes. The film thickness of the resist layer after heat treatment was 15 μm. Thereafter, although the resist layer was exposed using UV beams of wavelengths of 200 to 280 nm at an exposure of 500000 mJ/m², and developed using a developer of the following composition, the crosslinking reaction did not proceed, the unexposed portion was also dissolved in the developer, and the target ink flow path pattern could not be formed.

<Developer>
Diethylene glycol monobutyl ether: 60% by volume
Ethanol amine: 5% by volume
Morpholine: 20% by volume
Ion exchanged water: 15% by volume This application claims priority from Japanese Patent Application No. 2004-190484 filed Jun. 28, 2004, which is hereby incorporated by reference herein.

The invention claimed is:

1. A process for manufacturing an ink jet head comprising a discharge port for discharging an ink, an ink flow path communicated with said discharge port, and a substrate provided with an energy generating element for generating energy for discharging ink from the discharge port, characterized in that the process comprises:

providing a precursor comprising a first photosensitive resin layer laminated by a second photosensitive resin layer on said substrate, the second photosensitive resin layer including a composition comprising (a) a polyacrylate resin having structural unit represented by the following general formula (1), wherein the first photosensitive resin layer is positioned on the side of the substrate

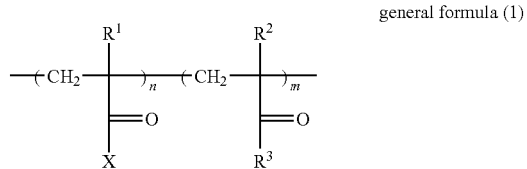

general formula (1)

wherein, X represents a hydroxyl group or a methylolamino group; $R^1$ and $R^2$ independently represent a hydrogen atom, or an alkyl group having 1 to 3 carbon atoms; $R^3$ represents an alkyl group having 1 to 3 carbon atoms, an alkoxyl group having 1 to 3 carbon atoms, or an aralkyl group having an aryl group or alkyl group with 1 to 2 carbon atoms; n represents a positive integer; and m represents 0 or a positive integer, and (b) a compound represented by the following general formula (2)

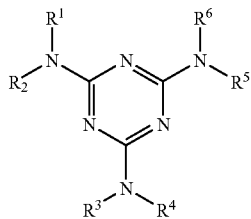

general formula (2)

wherein $R^1$ to $R^6$ independently represents a hydrogen atom, a methylol group, or an alkoxymethyl group to which an alkoxy group having 1 to 4 carbon atoms is bonded; provided that, at least two of $R^1$ to $R^6$ represent methylol groups, or alkoxymethyl groups to which an alkoxy group having 1 to 4 carbon atoms is bonded;

patterning, by a photolithographic process, said second photosensitive resin layer to form a second ink flow path pattern which has a shape of a portion of the ink flow path;

patterning said first photosensitive resin layer to form a first ink flow path pattern which has a shape of another portion of the ink flow path;

providing a coating resin layer for forming the wall of the ink flow path on said first ink flow path pattern and the second flow path pattern;

forming an ink discharge port in the coating resin layer; and removing the first ink flow path pattern and the second ink flow path pattern to form the ink flow path.

2. The process for manufacturing an ink jet head according to claim 1 characterized in that the second photosentive resin layer further comprises a photoacid generator.

3. The process for manufacturing an ink jet head according to claim 2 characterized in that the photoacid generator is at least one selected from the group consisting of aromatic sulfonium salts, aromatic iodonium salts and triazine compounds.

4. The process for manufacturing an ink jet head according to claim 1, wherein the coating resin contains a curable epoxy compound.

5. The process for manufacturing an ink jet head according to claim 1, wherein the coating resin contains a cationic photopolymerization initiator.

6. A process for manufacturing an ink jet head comprising a discharge port for discharging an ink, an ink flow path communicated with said discharge port, and an energy generating element for generating energy for discharging the ink, characterized in that the process comprises:

preparing a substrate provided with an energy generating element;

forming a first layer on the substrate;

forming a second layer on the first layer, wherein the second resin layer comprises a plurality of first compounds, the first compound having one selected from following structural units

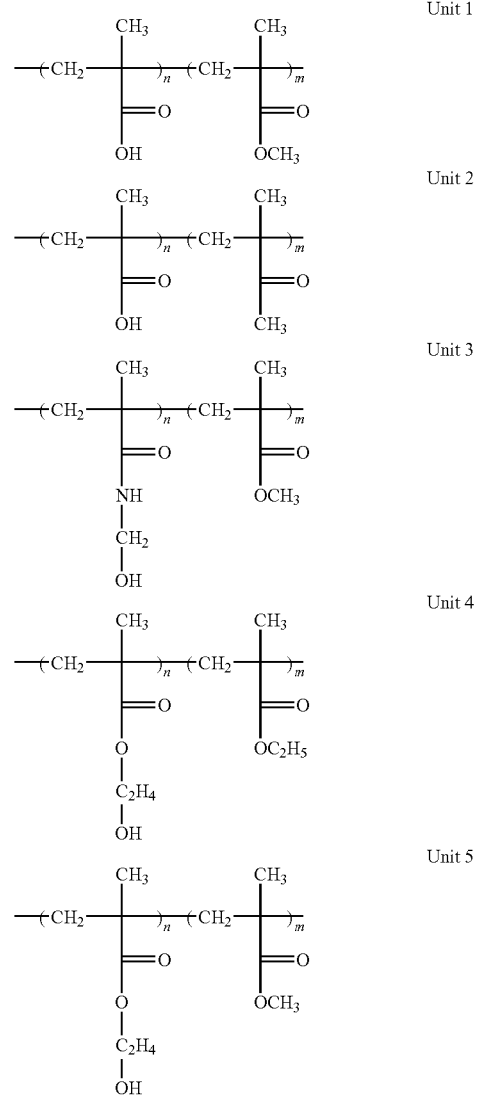

wherein m and n represent positive integers, and a compound represented by the following general formula (2)

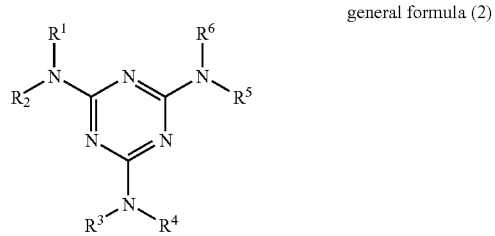

general formula (2)

wherein $R^1$ to $R^6$ independently represents a hydrogen atom, a methylol group, or an alkoxymethyl group to which an alkoxy group having 1 to 4 carbon atoms is bonded; provided that, at least two of $R^1$ to $R^6$ represent methylol groups, or alkoxymethyl groups to which an alkoxy group having 1 to 4 carbon atoms is bonded;

heating the second layer so as to crosslink the plurality of the first compounds each other;

patterning said second layer to form an ink flow path pattern;

patterning said first layer to form an ink flow path pattern;

forming a coating resin layer for forming the wall of the ink flow path, by solvent coating, on said ink flow path pattern;

forming an ink discharge port in the coating resin layer; and removing the ink flow path pattern to form the ink flow path.

7. The process for manufacturing an ink jet head according to claim 6, characterized in that said second layer comprises a photoacid generator, and patterning said second layer is performed by irradiating light to said second layer.

8. The process for manufacturing an ink jet head according to claim 7, characterized in that when said second layer is patterned, said crosslinked portions are decomposed by an acid generated in a reaction of said photoacid generator by irradiating said light to said second layer.

9. A process according to claim 1, wherein the first photosensitive resin is polymethyl isopropenyl ketone.

10. A process according to claim 1, wherein the polyacrylate resin having structural unit represented by the following general formula (1) is one selected from following structural units

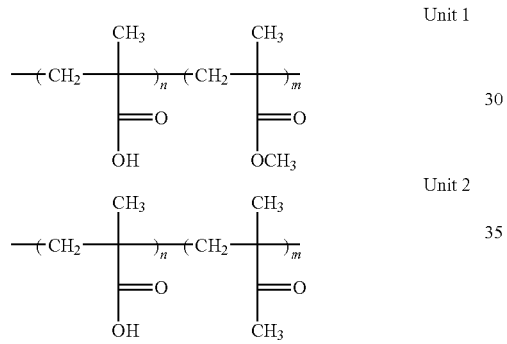

-continued

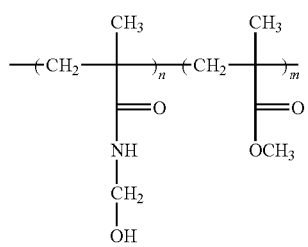

Unit 3

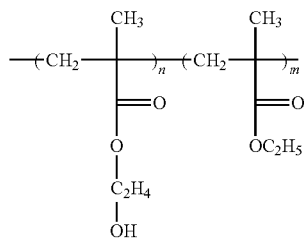

Unit 4

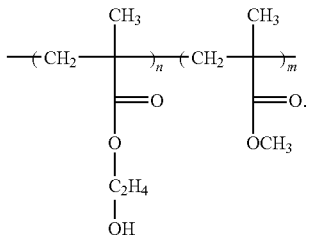

Unit 5

* * * * *